US007839184B2

(12) United States Patent
Smith et al.

(10) Patent No.: US 7,839,184 B2
(45) Date of Patent: Nov. 23, 2010

(54) MULTI-PURPOSE CURRENT DRIVER SYSTEM AND METHOD

(75) Inventors: Gregory H. Smith, Placentia, CA (US);
Robert N. Bassett, Orange, CA (US);
Anton B. Monge, Sunset Beach, CA (US); John J. Bollinger, Orange, CA (US)

(73) Assignee: The Boeing Company, Chicago, IL (US)

( * ) Notice: Subject to any disclaimer, the term of this patent is extended or adjusted under 35 U.S.C. 154(b) by 162 days.

(21) Appl. No.: 11/865,428

(22) Filed: Oct. 1, 2007

(65) Prior Publication Data

US 2009/0085612 A1    Apr. 2, 2009

(51) Int. Cl.
*H03K 3/01*    (2006.01)
(52) U.S. Cl. ..................................... 327/108
(58) Field of Classification Search ......... 327/108–111, 327/538, 540
See application file for complete search history.

(56) References Cited

U.S. PATENT DOCUMENTS

| | | | | |
|---|---|---|---|---|
| 5,428,492 A | * | 6/1995 | Swonger | 361/18 |
| 5,479,618 A | * | 12/1995 | Van de Steeg et al. | 700/23 |
| 5,585,749 A | * | 12/1996 | Pace et al. | 327/108 |
| 6,267,326 B1 | | 7/2001 | Smith et al. | |
| 6,911,923 B1 | * | 6/2005 | Wang et al. | 341/100 |
| 7,012,378 B1 | * | 3/2006 | Wells et al. | 315/194 |
| 7,262,652 B2 | * | 8/2007 | Omori et al. | 327/538 |
| 7,365,594 B2 | * | 4/2008 | Kojima et al. | 327/538 |

\* cited by examiner

*Primary Examiner*—Hai L Nguyen
(74) *Attorney, Agent, or Firm*—Harness, Dickey & Pierce, P.L.C.

(57) ABSTRACT

A current driver system and method for generating one or more independent current signals for controlling or driving an external device. In one embodiment the system includes a programmable controller having both serial and parallel interfaces, and controls six independent current driver channels. Each current driver channel may form a dual stage channel that generates two different level current signals. Each current driver channel may include an overcurrent monitoring circuit as well as a loop back subsystem, where the loop back subsystem generates a signal that the programmable controller, and thus an external device in communication with the controller, can use to verify that proper communication is occurring between the controller and the current driver channel. The controller also synchronizes the turn on and turn off points for each current signal to a master system clock.

16 Claims, 9 Drawing Sheets

MULTI-PURPOSE CURRENT DRIVER SYSTEM AND METHOD

FIELD

The present disclosure relates to current driver systems, and more particularly to a multi-purpose current driver circuit capable of providing a plurality of independently controllable current driver stages each having single or dual stage regulated current outputs, and able to used with either serial or parallel interfaces to drive various types of resistive and/or inductive loads.

BACKGROUND

The statements in this section merely provide background information related to the present disclosure and may not constitute prior art.

Present day current driver circuits used in various electronic applications have somewhat limited flexibility in adapting them to diverse applications. Some applications may require direct current (dc) through resistive loads for ordnance drive. Some applications may require switching current through a combination of inductive and resistor loads for motors and valves or actuators. Often, for certain applications, dual stage current outputs may be desirable or needed. In such instances a plurality of independent current driver circuits may be required to provide the needed current driver capability for the device(s) being controlled. For example, with certain valves and actuators used in aerospace applications, one current drive signal of a first magnitude and/or duration may be required to open/actuate the component while a different signal (typically of lesser current) may be required to maintain the component in its actuated/open position.

Present day current driver systems also typically lack the flexibility to be used with different types of interfaces, and are thus typically configured for use with a specific style of interface (e.g., either serial or parallel). Still further present day current driver systems often lack other various features that enable verifying that control signals sent to the current driver circuit have actually been received and acted on by the current driver system. Such present day systems often do not provide for programming of the exact current turn-on and turn-off points for the current driver system.

All of the foregoing limitations of typical present day current driver systems typically result in more complex and costly systems because no one current driver system provides the desired level of functionality required in many applications. This often necessitates the use of multiple current driver systems. The requirement for using multiple current driver systems also increases the overall weight of the electronics system, as well as increasing the physical space needed for its implementation.

SUMMARY

The present application is directed to a current driver system and method that can be used to drive a wide range of external devices such as electronic valves, actuators, motors, ordnances, etc., all in one package.

In one specific embodiment the current driver system comprises a dual stage system that provides different, regulated first and second current drive outputs for controlling or actuating an external device or subsystem. Overcurrent protection is provided to ensure that in the event of a short circuit or malfunction of the external device, that only a maximum current may be drawn. This ensures against damage to the current driver system in the event of such a condition or malfunction. The current driver system may also include a controller that enables the turn-on and turn-off points for the current pulses being generated to be digitally synchronized based on a user-defined reference for low noise operation of sensors.

In another embodiment the current driver system forms a multi-channel system having a plurality of independent current driver channels that are each controlled by a controller. The controller is programmed so that each current driver is tailored to meet the needs of the specific external device that it is used to drive or actuate.

In various other specific embodiments the current driver system and method may provide for both serial and parallel interfaces. In still another embodiment the current driver system may form a single stage system with one or more of the above enumerated features. Still other embodiments may include a loop-back feature (i.e., handshaking) to provide a feedback signal that verifies to the user that control signals that have been sent to the current driver system have been received by the system before the current drive signals are actually generated and applied to drive/actuate the external device.

In still other implementations the current driver system and method includes internal power regulation circuitry for generating a plurality of different direct current (dc) voltages for driving various electronic components of the system. Still other implementations include low thermal coefficient of expansion (TCE) coiled sense resistors, for example, 100 milliohms±1 milliohm that can handle 250 milliwatts of continuous power with a temperature coefficient of resistance of ±0.00002 Ohms/Ohms/° C. over a temperature range of −55 to 125° C. and capable of fitting in a 50 mil by 150 mil footprint (1.27 mm by 3.81 mm). The sense resistors can be used to convert the current to a highly accurate sense voltage, which can then be compared via a comparator circuit to a precision voltage reference. This enables the system to provide a highly accurate determination of the output current being delivered by the one or more current driver channels.

BRIEF DESCRIPTION OF THE DRAWINGS

The drawings described herein are for illustration purposes only and are not intended to limit the scope of the present disclosure in any way.

DETAILED DESCRIPTION

Figure 1:
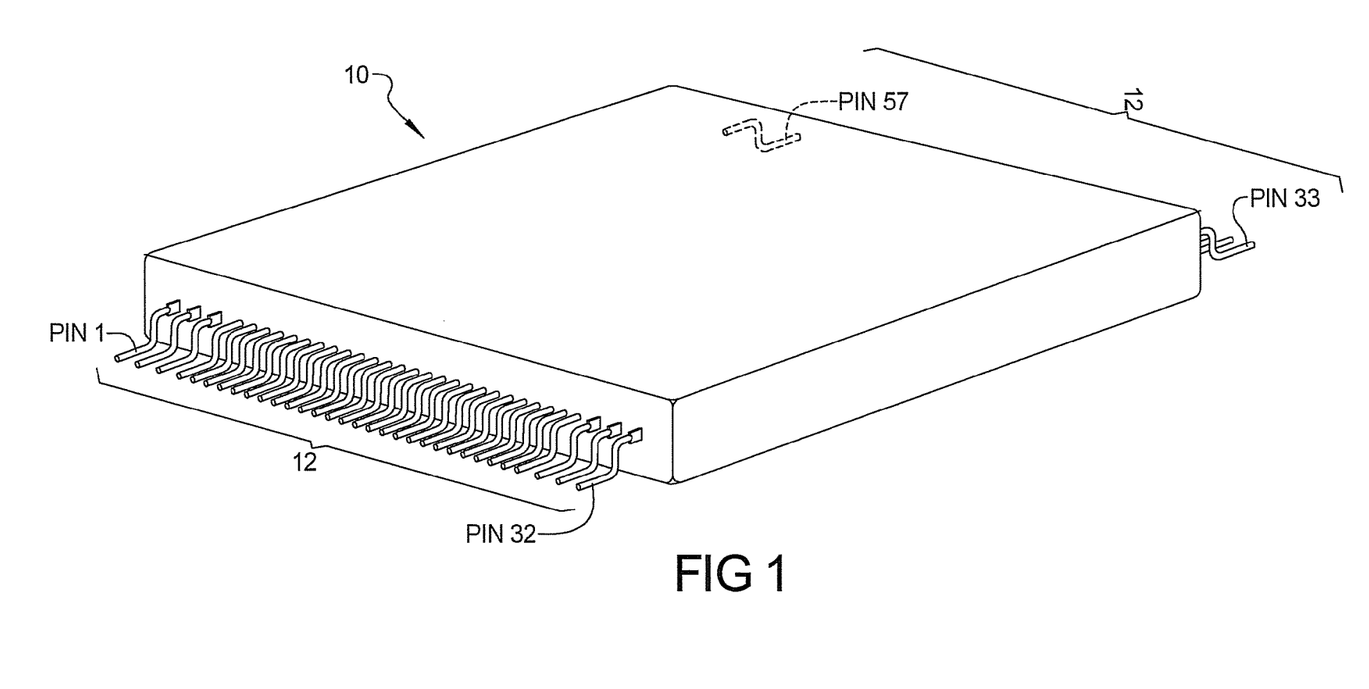
FIG. 1 is a perspective view of a current driver system in accordance with one embodiment of the present disclosure.
Figure 1A:
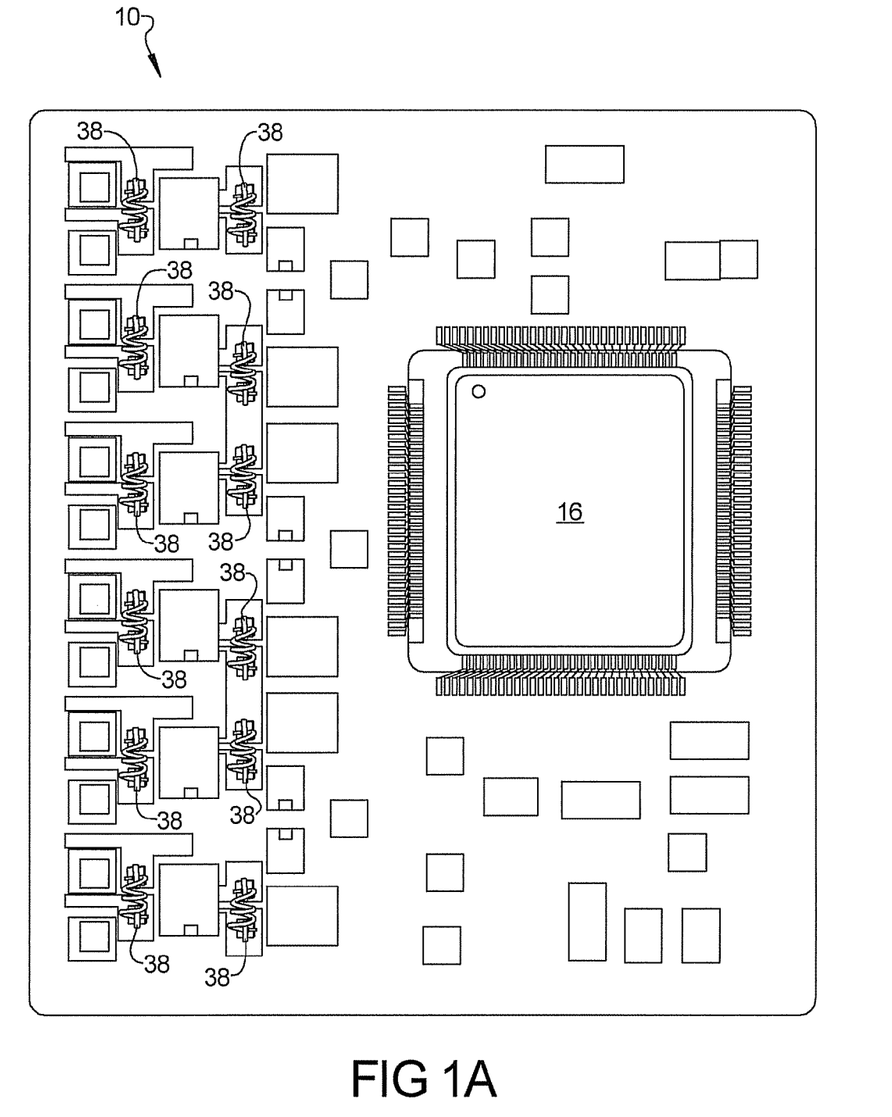
FIG. 1A is a plan view of the current driver system with a top cover thereof removed, illustrating the various components and layout thereof.

Referring to FIGS. 1 and 1A, there is shown a current driver system 10 in accordance with the present disclosure. In this example, the system 10 forms a module having a plurality of pins 12 that may be coupled to various inputs and outputs, depending on the precise implementation that the system 10 will be used in. A particular advantage of the system is its highly compact construction. In the illustrated embodiment, the system 10 comprises dimensions of approximately 2.0 inch×2.0 inch and 0.25 inch in thickness (50.8 mm×50.8 mm×6.35 mm). Accordingly, the system 10 can be easily packaged into printed wiring board assemblies as a portion of a larger overall system.

Figure 2A:
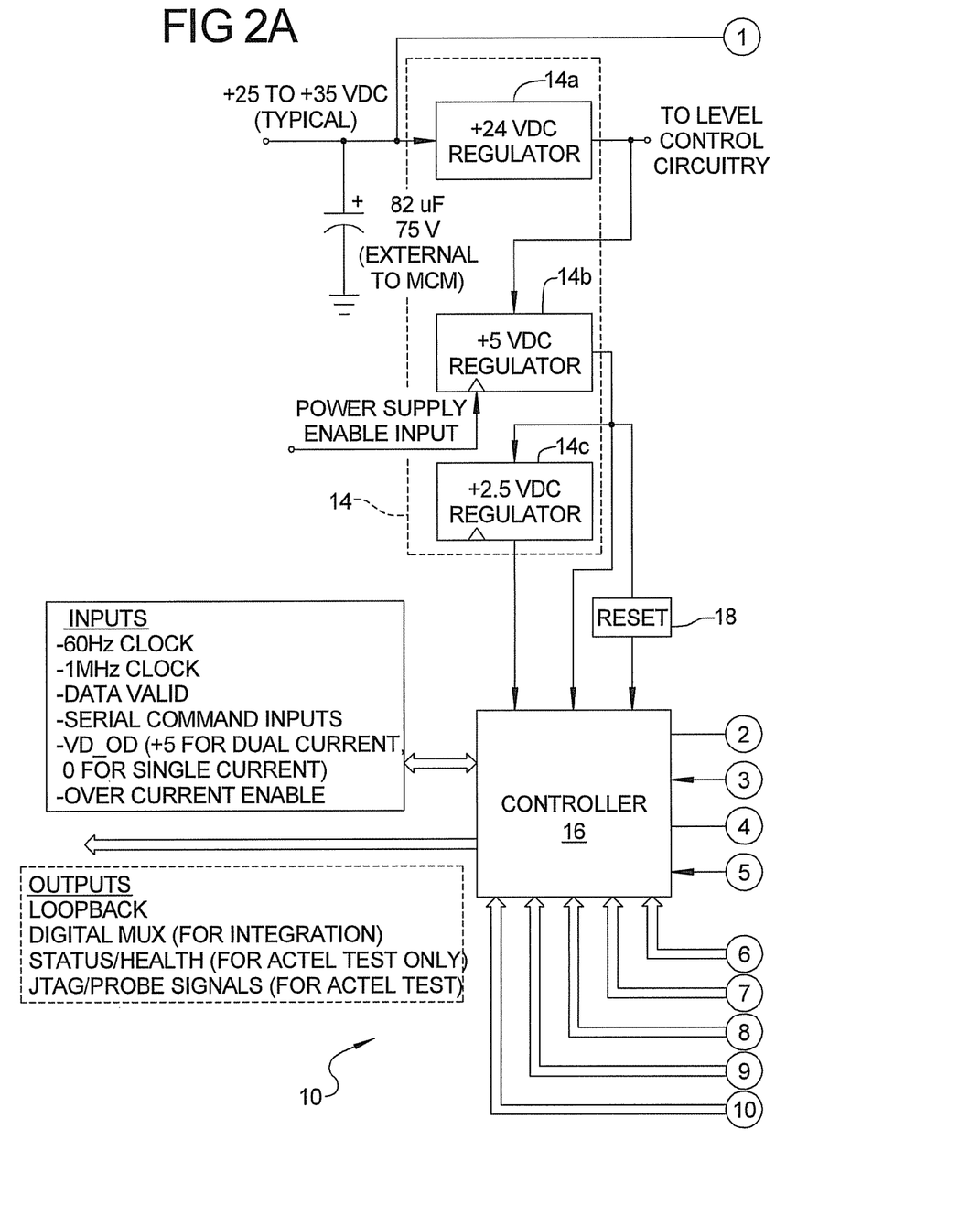
FIG. 2 is a block diagram of the internal components of the system of FIG. 1.
Figure 2B:
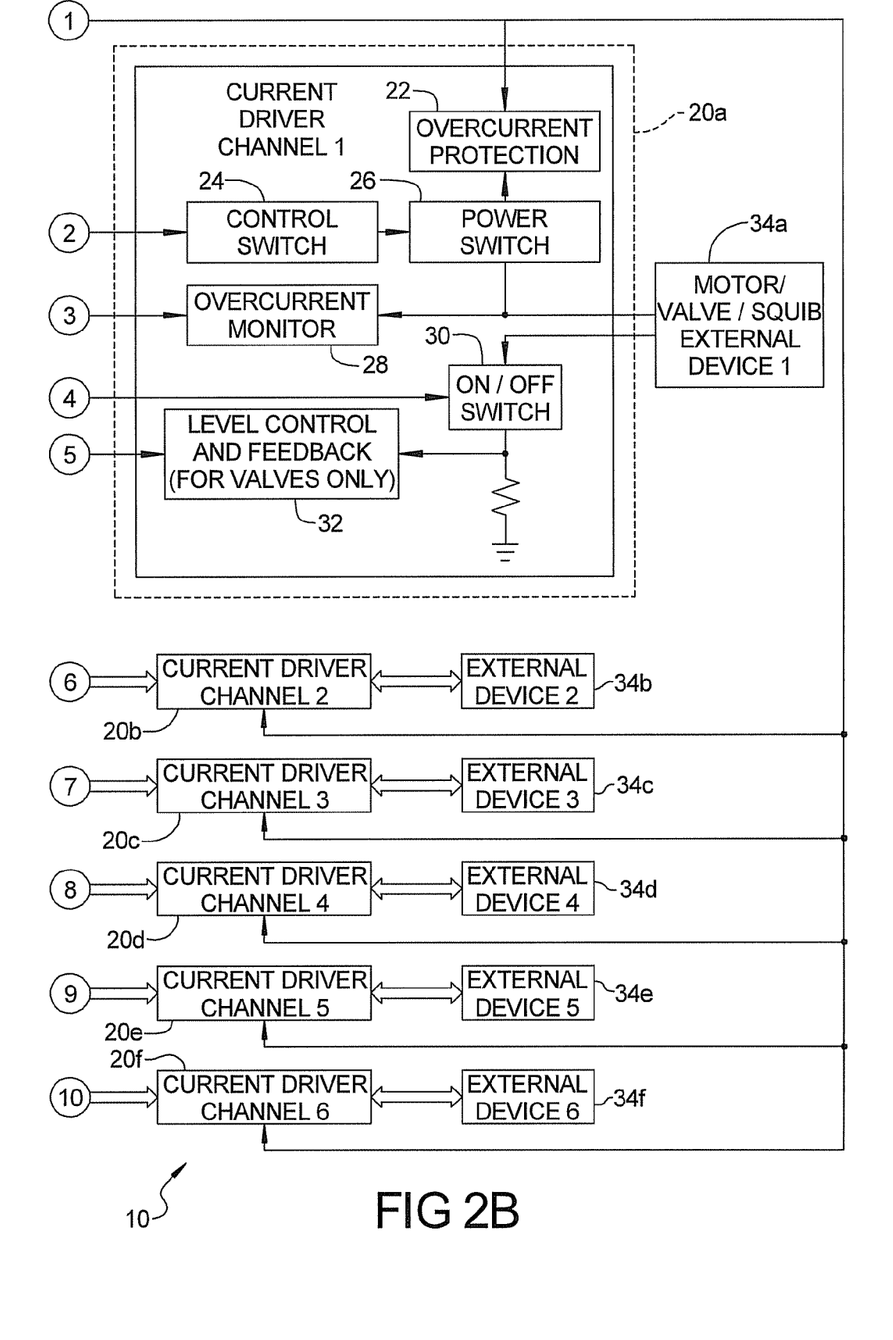

Referring to FIGS. 2A and 2B, a block diagram of major components and/or subsystems of the system 10 is shown. The system 10 includes a voltage regulator section 14, a programmable controller 16 (for convenience, hereinafter referred to as the "controller"), a reset circuit 18, and in this embodiment six independent current driver subsystems 20a-20f that form six independent current driver channels. For convenience, the current driver subsystems 20a-20f will be referred to throughout the following discussion as "current driver channels 20a-20f". The current driver channels 20a-20f are identical in construction, although they may be varied for different current loads, so only channel 20a has been shown in detail in FIG. 2. It will be appreciated that a greater or lesser plurality than six independent current driver channels 20a-20f may be employed to meet the needs of a specific application. The specific type of controller 16 selected for use will need to be selected so as to accommodate the total number of current driver subsystems being used in the system 10. In one embodiment the controller 16 is a field programmable gate array (FPGA) available from the Actel Corp. of Mountain View, Calif. The reset circuit 18 insures that the controller 16 initializes to a known state after the application of the 5 Vdc and 2.5 Vdc power sources.

Current driver channel 20a includes an overcurrent protection circuit 22, a control switch 24, a power switch 26, an overcurrent monitoring circuit 28, an on/off switch 30 and a level control and feedback circuit 32. The current driver subsystem is used to control an external device or subsystem 34a that may comprise an electronic valve, actuator, motor, ordnance, squib (i.e., small explosive device), or virtually any other form of electronic component that requires a current signal for its use or control. Current driver channels 20b-20f may, of course, be of different construction to provide different current outputs as the requirements of an application may dictate.

The regulator circuit 14 provides a +24Vdc regulator circuit 14a that provides a regulated +24Vdc output for the internal analog circuitry. A +5Vdc regulator circuit 14b is included for providing a regulated +5Vdc output. A +2.5Vdc regulator circuit 14c provides a regulated 2.5Vdc output. The +24Vdc, +5Vdc and +2.5Vdc regulated outputs are used to power the various electronic circuit components used in the system 10. Advantageously, the system 10 does not require any regulated supply input for powering its various internal components. Additionally, the regulator circuit 14 can be adapted to meet the needs of a particular embodiment.

In general operation, the controller 16 receives a plurality of clock inputs for providing timing signals, a serial or parallel command input, and an overcurrent "enable" input. The overcurrent enable input sets the controller 16 to receive an "overcurrent" warning signal in the event that the external device of any particular current channel attempts to draw a current that exceeds a predetermined maximum level set for its associated current driver channel 20a-20f. The controller 16 controls each of the current driver channels 20a-20f to generate outputs, based on the input commands received (either in serial or parallel form). The outputs of each current driver channel 20a-20f may be either single stage or dual stage, meaning that each current driver channel may supply either a single current output signal or two different current signals (i.e., current signals of different magnitudes. This is particularly valuable in controlling certain types of external devices such as electric valves or motors, which may require a greater current signal to initiate rotational operation, but then a lesser magnitude current signal to maintain rotational operation. The output signal from the controller 16 is applied to the control switch 24 which is used to control switching operation of the power switch 26. The current flowing through the power switch 26, when the switch 26 is turned on, forms the current drive output signal from the current drive channel 20a that is applied to the external device 34a.

During operation, the current flowing through the power switch 26 (and thus through the overcurrent protection circuit 22) is sensed by the overcurrent monitoring circuit 28 which provides an output signal to an input of the controller 16 (see FIG. 5 step 503) that is indicative of the current signal being provided to the external device 34a. The controller 16 monitors this signal and if the external device 34a is inadvertently shorted to ground, then the controller sends a signal to the control switch 24 and the on/off switch 30 to interrupt the flow of current through the external device 34a. Current is shutoff during the remaining on-time cycle. When the channel is exercised again, the predetermined current will flow to the external device 34a unless the short to ground is still present. This prevents damaging any part of system 10 until the short is removed from the load 34a. The level control and feedback circuit 32 senses the current drawn by the external device and compares it to a reference level and sends a feedback signal to the controller 16 (to be discussed further in connection with operations 507, 510 and 514 in FIG. 5). The controller 16 uses this signal to determine when to turn the control switch 24 off or on. The controller 16 may also use this information to generate a "status/health" signal that can be used by a different external subsystem to verify proper operation of the given external device 34a.

Figure 3:
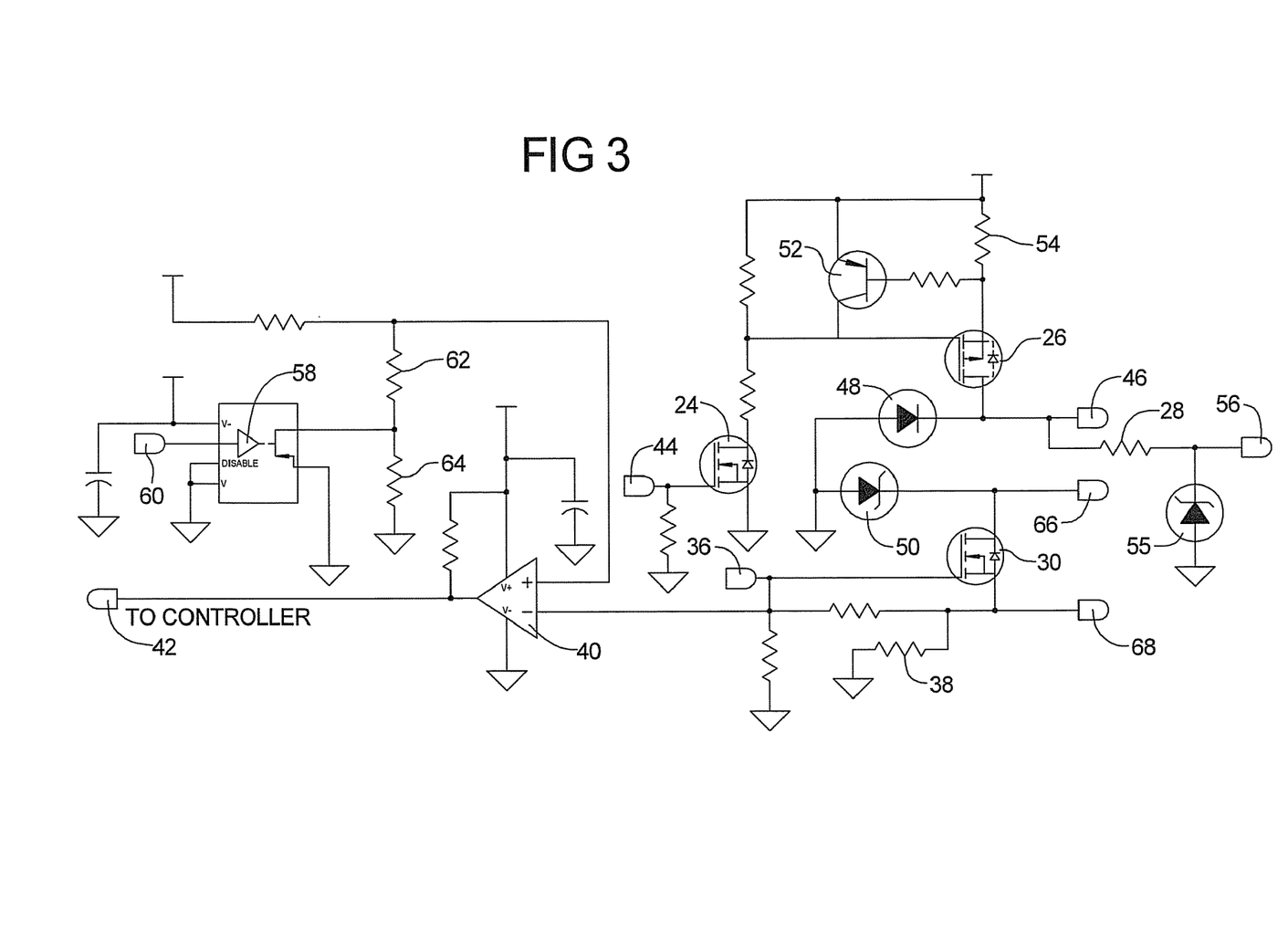
FIG. 3 is an electrical schematic diagram of one embodiment of the first current driver channel of the system shown in FIG. 2, with exemplary component values being provided for each of the electrical/electronic components illustrated in the schematic diagram.

Referring to FIG. 3, a detailed electrical schematic diagram is shown for current driver channel 20a (channel 1). All of the current driver channels 20a-20f may be configured with a totem-pole output operated in a switching mode. Initially, a command signal "CMD1" from the controller 16 is applied to input 36 which is coupled to the gate of a field effect transistor (FET) that forms the on/off switch 30. Turning on FET 30 enables a current return path from the external device 34a (i.e., the load) through the FET 30. The load is sensed by sense resistor 38 and fed into the inverting input of comparator 40. The non-inverting input of comparator 40 receives a reference voltage signal against which the signal on the inverting input is compared. The output 42 of comparator 40 is fed back to the controller 16 which uses this signal to generate a control signal at input 44 (i.e., "FET1") to controllably switch the control switch 24, in this instance a FET (for convenience designated "FET 24"). The signal at input 44 controllably switches the FET 24 on and off causing the current drive signal to the output power switch 26, in this example another FET (referred to as "FET 26"). This in turn causes FET 26 to turn on and off, which controls the drive current to the external device at output 46. The switching is controlled at the control loop frequency of 100 KHz, which is the 1 MHz external clock signal to the controller 16 divided down to 100 KHz. This frequency operates within the switching speed allowed by the gate capacitance of the FETs used in the system 10.

When the FET 26 turns off during its regulated duty cycle off time, diode 48 pulls current from ground to the regulated current level. When the channel is commanded off, FET 30 is turned off and the voltage suppressor 50 limits the voltage from the "inductive kick" to approximately 58.9 volts during turn off. Energy in the load 34a is dissipated quickly in the voltage suppressor 50. Over current protection against overloading on the FET 26 load terminal is provided by bipolar junction transistor 52 and sense resistor 54. The transistor 52 and the sense resistor 54 collectively form the overcurrent limit protection circuit 22 of FIG. 2. Excessive current through sense resistor 54 causes transistor 52 to turn on and reduce the bias voltage on the gate of FET 26, thus limiting the amount of current sent to the load terminal 46 and available to the external device 34a. The overcurrent monitor 28 (FIG. 2) is formed by a resistor in FIG. 3 (labeled with reference numeral 28) and zener diode 55, which provides a signal to current sense output 56, which is then fed back to the controller 16. This signal is limited to 5 volts by zener diode 55, and is used by the controller 16 to detect when an overcurrent situation has developed. For example, if the load 34a is shorted to ground inadvertently, the signal at 56 becomes 0V instead of 5V. The controller 16 then shuts off the signal to input 44 until the next commanded "on" cycle.

Figure 3A:
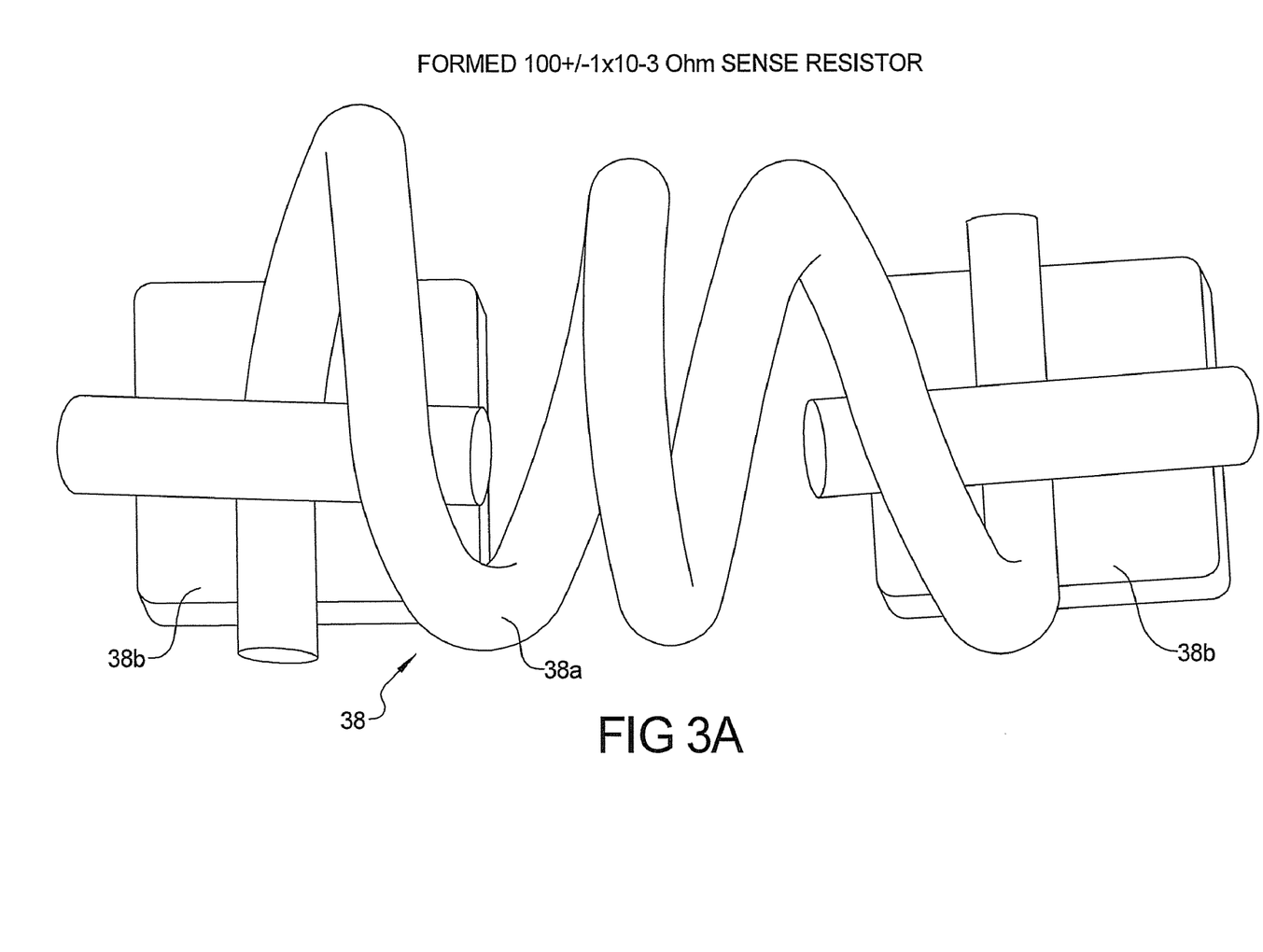
FIG. 3A is a highly enlarged plan view of one embodiment of a sense resistor used in the current driver system.

In one specific embodiment, sense resistors 38 and 54 are formed by low thermal coefficient of expansion (TCE) coiled sense resistors that are constructed from a helically formed alloy wire. Sense resistors 38 and 54 can have a resistance value of 100 milliohms±1 milliohm, that can handle 250 milliwatts of continuous power with a temperature coefficient of resistance of ±0.00002 Ohms/Ohms/° C. over a temperature range of −55 to 125° C. Advantageously, each sense resistor is able to fit in a 50 mil by 150 mil (1.27 mm by 3.81 mm) footprint, and thus help enable the system 10 to be implemented in a highly space efficient package. However, any other suitable form of sense resistor may be employed provided it has suitable power handling and tolerance values. FIG. 3A shows an example of sense resistor 38. Sense resistor 38 may be comprised of a coil of #29 gauge Advance wire 38a welded to two Kovar pads 38b having a dimension of about 50 mils (1.27 mm) square with a thickness of about 10 mils (0.254 mm). The weld points between the pads and the wire may be set by a suitable tool for the assembly and are spaced preferably about 0.549 inches (13.95 mm) apart for the particular lot of wire. The dimension is adjusted to correct for the resistivity of the lot of wire used. The wire 38a is coiled into three circular turns on a forming tool to have a maximum diameter of about 75 mils (1.905 mm) and the pads 38b are spaced about 50 mils (1.27 mm) apart on a planar surface.

With further reference to FIG. 3, solid state switch 58 and voltage divider circuit 60 are used to control the value of the reference voltage that is applied to the non-inverting input of the comparator 40. This enables two distinct "threshold" reference voltages to be used in the event a dual stage current output signal is being generated by the system 10. In many applications of valves and actuators, a larger pull-in current is needed to initially open a valve. A lower hold current can be applied at a predetermined number of milliseconds later to reduce heating in the load. More particularly for the lower threshold current, when the input 60 of the solid state switch 58 receives a signal from the controller 16 that enables the solid state switch 58, this shorts out resistor 64 of resistor pair 62 and 64, thus changing the resistance of the resistor divider network of resistors 62 and 64 and giving the lower threshold voltage that generates the lower threshold current. Thus, the reference voltage generated at the non-inverting input can be selectively controlled by the controller 16. The output 66 ("Out_Lo_1") in FIG. 3 is the return terminal to the external device 34a. Output 68 ("TEL1") is the sensed voltage of the external device 34a return current that can be used for external telemetry purposes.

Such action may or may not involve interrupting a current drive signal that is presently being applied to the external device 34. If the comparator 42 signal is received by the controller 16, then normal operation of the system 10 continues. It will also be appreciated that while the above description of operation focuses on the operation of a single current drive channel, that in practice each of the independent current drive channels 20a-20f are checked sequentially, and repeatedly, while the system 10 is in operation.

Figure 4A:
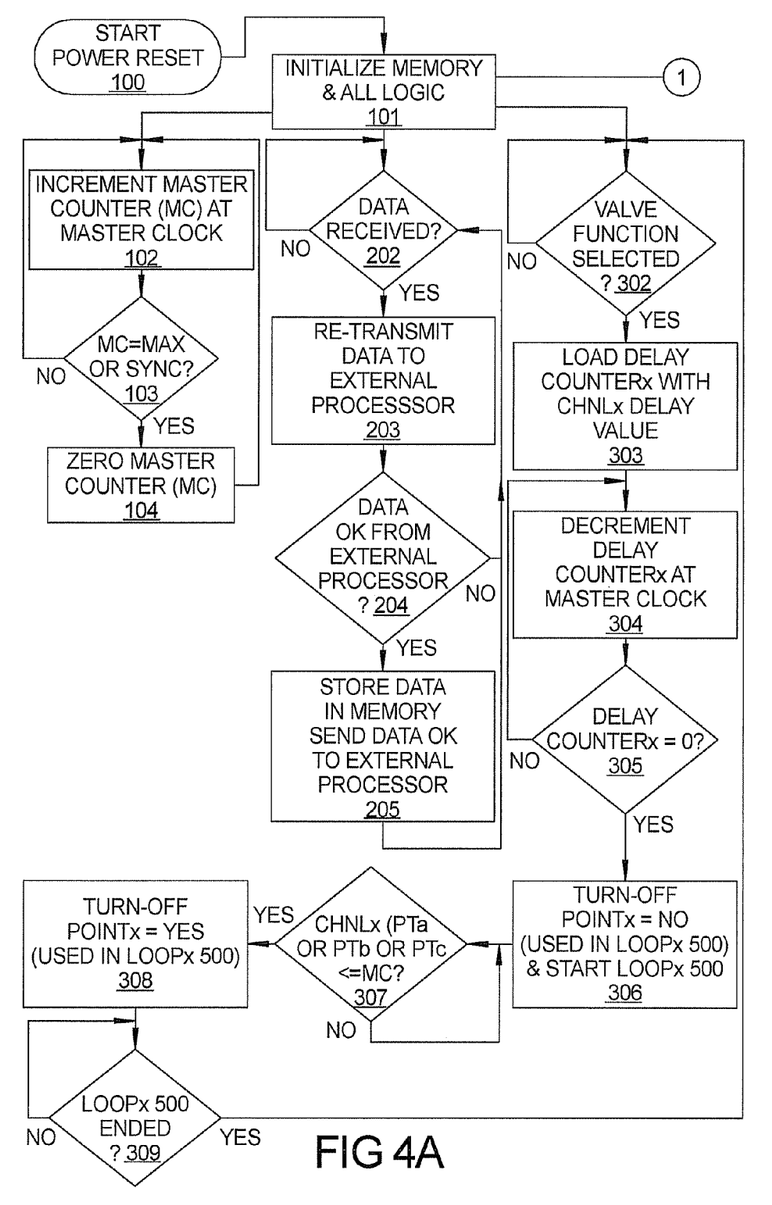
FIGS. 4 and 5 are flowcharts illustrating major operations performed by one implementation of the system.
Figure 4B:
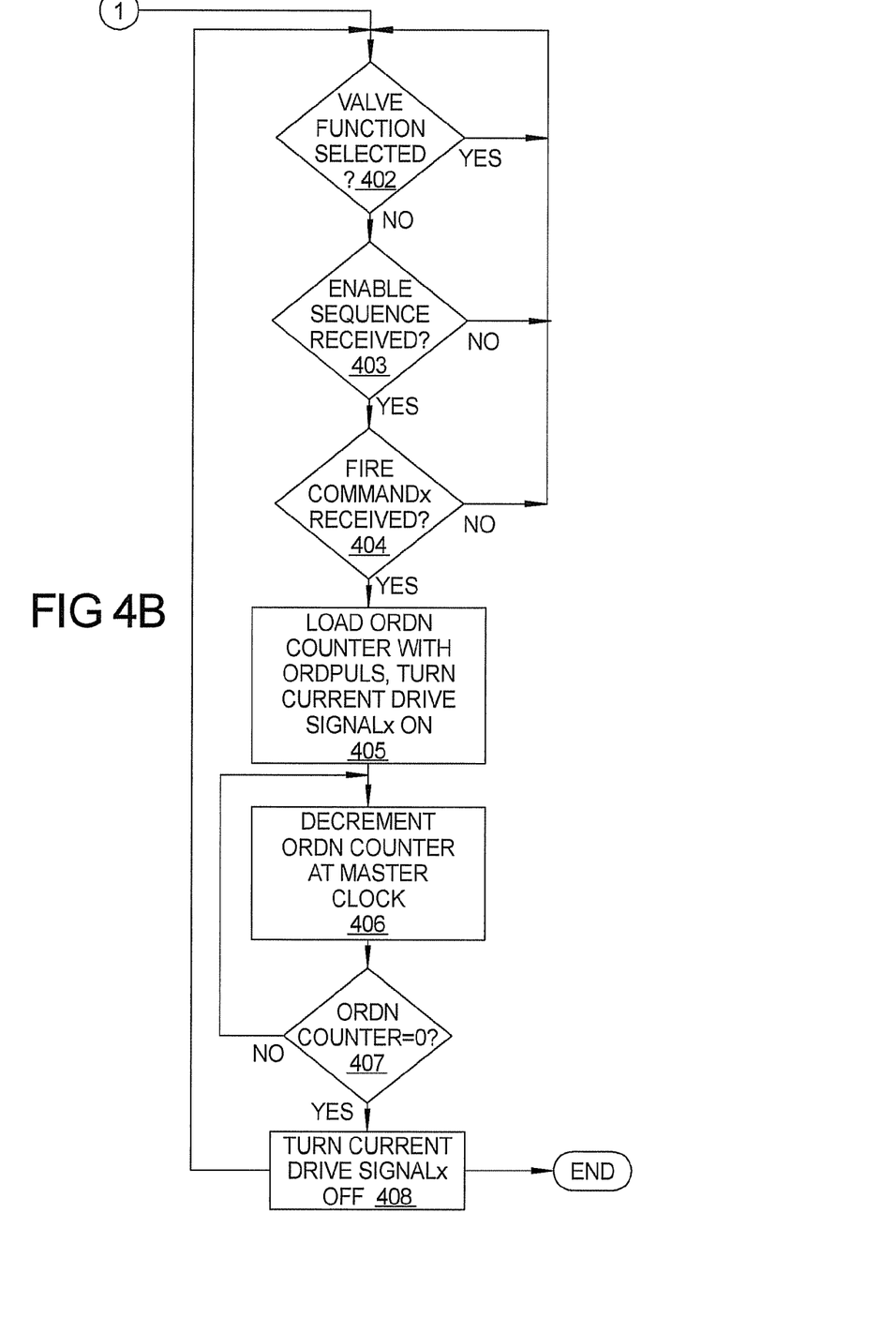
Figure 5:
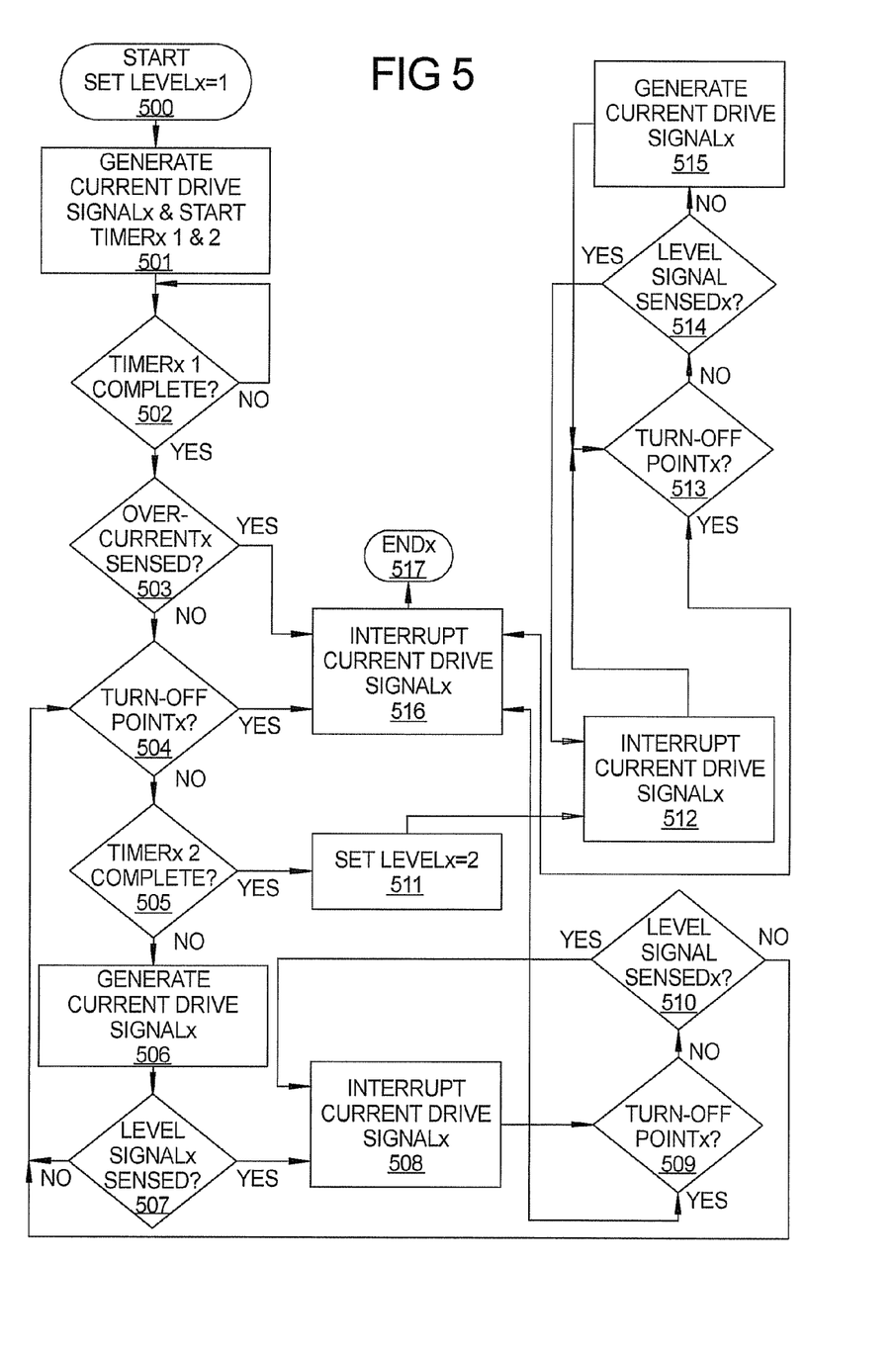

Referring to FIGS. 4 and 5, the system 10 provides one 15 bit (minimum length) Master Counter [MC] incremented by a 1 MHz clock. The Master Counter is reset to zero when a 60 Hz negative edge or Master Counter greater than MCMAX (a system loaded number) occurs. The system 10 provides the capability to control a delay time before Turn-on of the current drive signal, and the Turn-off points in each 60 Hertz cycle for each of six valve channels. The system 10 provides three 15 bit (preferably minimum length) registers for each valve corresponding to the absolute Turn-off points and one 15 bit (preferably minimum length) register for each valve corresponding to the relative DELAY to ON time counts for that particular valve (each LSB=1.0 µs). The DELAY to ON time register for each valve is read at the corresponding valve Turn-off points and this value used to generate the Delay to ON timeout (to be described in connection with FIG. 4).

Control of ordnance may be accomplished by a single pulse output of 50 milliseconds width. The system 10 provides system safing of the Ordnance outputs by providing a software "Ordnance Enable" function which must be set TRUE for any Ordnance output to be activated. Ordnance Enable logic (ORDEN) is reset at power on and whenever an Ordnance output is activated, loads to the Ordnance register address with data contents of '2A5A' HEX followed by '3AA2' HEX sets ORDEN TRUE, any other sequence resets ORDEN FALSE.

Referring specifically to FIG. 4, a flowchart is illustrated of overall operation for one particular channel of the system 10. At operation 101, memory and all logic for the system 10 is initialized at power application to the system operation 100. Operations 102-104 serve to generate the Master Counter number from the master clock input of the system and run simultaneously with operations 202-205, 302-309 and 402-408 operations. At operation 202 a check is made if serial data is being received from an external processor. If "yes", then the data is re-transmitted to the external processor (not shown) at operation 203. A check is made if the data is received properly by the external processor at operation 204. If "yes", the data is stored in memory and an "OK" signal is sent to the external processor.

Operations 302-309 describe the operation of controlling an electronic valve cycle. At operation 302, a check is made if a valve function has been selected. If the valve function is selected, operation 303 occurs, the valve off interval (CHNLx DELAY VALUE) is loaded into a counter (COUNTERx) and counted down once per master clock input. The counter is checked at operation 305 for zero (indicating completion of the valve off interval). If the result is no then the turn-off interval has not completed and the channel remains off. If yes the turn-on point has been reached, the TURN-OFF POINT variable (used in loop 500) is set to NO and the subroutine 500 in FIG. 5 is started (to be explained in the following paragraphs). At operation 307 a check is made if the channel turn off points (Pt) "a", or "b" or "c" is less than or equal to the master counter (MC). If "yes", at operation 308, the turn off point is determined to have been reached and the variable TURN-OFF POINT (used in loop 500) is set to YES. At operation 309 a check is made if the subroutine 500 in FIG. 5 has been ended (indicating the valve current is off). If "yes", operation 302 is entered and a new valve cycle begins.

Operations 402-408 describe control of the ordnance cycle. At operation 402 a check is made if a valve function has been selected. If not, at operation 403 a check is made if an ordnance enable sequence has been received. If so, a check is made if a "Fire" command has been received, as indicated at operation 404. If so, the ordnance counter (ORDN counter) is loaded with "ORDPULS" (a number representing the ordnance on interval time), and a current drive signal is turned on at operation 405. An ORDN counter is then decremented at the master clock, as indicated at operation 406. A check is then made if the ORDN counter is equal to zero at operation 407. If so, the current drive signal is then turned off, as indicated at operation 408. If not, operations 406 and 407 are repeated until the ORDN counter reads "0", and then operation 408 is performed.

FIG. 5 illustrates the execution of a dual stage current control loop within the controller 16. It will be appreciated that this loop is only active when the valve function is selected. The subroutine starts at operation 500, and at operation 501 a current drive signal is generated and timers 1 and 2 are started (timer 1 allows the overcurrent sensed signal to stabilize before being used and timer 2 sets the duration of the high pull-in current level). At operation 502 a check is made if Timer 1 is complete, and if so, a check is made if an overcurrent condition is being sensed at operation 503. If an overcurrent condition exists, the subroutine is ended at operation 516 and 517. If no overcurrent condition exists, a check is made at operation 504 if the current Turn-off point has been reached (a variable generated by loop 300 in FIG. 4). If yes, the current drive signal is interrupted by the controller 16 at operations 516 and 517. If the inquiry at operation 504 produced a "no" answer, then at operation 505 a check is made if Timer 2 has timed out. If so, the low current level is set at operation 511, the current drive signal is interrupted at operation 512, and a check is made if the Turn-off point has been reached at operation 513. If the answer at operation 513 is "yes", then the current drive signal is interrupted at operation 516 and 517. If the answer is "no", then the level signal is sensed at operation 514, and if this inquiry produces a "yes" answer, then the current drive signal is interrupted at operation 512. If the inquiry at operation 514 produces a "no" answer, then the current drive signal is generated and operation 513 is repeated.

If the inquiry at operation 505 produces a "no" answer, then the current drive signal is generated at operation 506. The level signal is then checked at operation 507, and if present, then the current drive signal is interrupted at operation 508. At operation 509 a check is made if the Turn-off point is reached and, if so, operation 516 is executed. If the answer is "no" at operation 509, then another check is made if the level signal is sensed at operation 510 and, if so, then the current drive signal is interrupted at operation 508. If the inquiry at operation 510 produces a "no" answer, then operation 504 is repeated.

The system 10 and method thus forms a means for a controlled current drive signal to a plurality of independent external devices, and for monitoring operation to ensure that if an overcurrent condition develops, that immediate action can be taken to avoid damage to the system 10 or the external device. A particular advantage of the system is the wide ranging and various features that it combines into a highly compact system (i.e., module).

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A multi-channel current driver system comprising:
   a programmable controller;
   a current driver subsystem for generating first and second different current signals that are applied to an external component; and
   the programmable controller being programmed to control said current driver subsystem to selectively cause said current driver subsystem to generate said first and second current signals; and
   the current driver subsystem further including:
      a master clock input for supplying a master clock signal to said programmable controller;
      said programmable controller being configured to enable a current turn on point and the current turn off point, for each of said current signals, to be synchronized to said master clock signal;
      a timer in communication with said programmable controller for setting a specific delay time interval corresponding to a specific current turn off point, from a plurality of available different time delay intervals that correspond to a plurality of different current turn off points; and
      said programmable controller interrupting said first current signal upon a detected expiration of said specific time delay interval and applying said second current signal.

2. The current driver system of claim 1, wherein said current driver subsystem comprises an overcurrent monitoring circuit for monitoring a level of said current signals and generating a signal if either of said current signals exceed a predetermined threshold.

3. The current driver system of claim 1, wherein said programmable controller comprises a programmed logic device.

4. The current driver system of claim 1, further comprising a parallel interface and a serial interface.

5. The current driver system of claim 1, wherein said programmable controller further comprises an input signal loop-back system for providing an output signal corresponding to an input signal, to thus verify receipt of said input signal to an external subsystem.

6. The current driver system of claim 1, further comprising:
   a first voltage regulator for providing a first regulated voltage;
   a second voltage regulator for providing a second regulated voltage different than said first regulated voltage; and
   a third voltage regulator for providing a third regulated voltage different than both of said first and second regulated voltages.

7. The current driver system of claim 1, further comprising a reset circuit for enabling a reset signal to be applied to said programmable controller.

8. A multi-channel current driver system comprising:
   a programmable controller responsive to a master clock input signal;
   a plurality of current driver subsystems that each generate a current signal that is applied to an associated external component;

the programmable controller being configured to turn-on each of said current signals and to turn off each of said current signals in synchronization with said master clock input signal;

a serial interface for interfacing said programmable controller to a first external subsystem generating a serial output;

a parallel interface for interfacing said programmable controller to a second external subsystem generating a parallel output; and wherein said programmable controller further comprises an input signal loopback system for providing an output signal corresponding to an input signal, to thus verify receipt of said input signal to an external subsystem;

a timer in communication with said programmable controller for setting a specific delay time interval corresponding to a specific current signal turn off point, from a plurality of available different time delay intervals that correspond to a plurality of different current signal turn off points; and said programmable controller interrupting a first current signal upon a detected expiration of said specific time delay interval and applying a second current signal.

9. The current driver system of claim 8, wherein said current driver subsystem further comprises an overcurrent monitoring circuit for monitoring a level of said current signals and generating a signal if said current signal exceeds a predetermined threshold.

10. The current driver system of claim 8, further comprising:

a first voltage regulator for providing a first regulated voltage;

a second voltage regulator for providing a second regulated voltage different than said first regulated voltage; and a third voltage regulator for providing a third regulated voltage different than both of said first and second regulated voltages.

11. The current driver system of claim 8, further comprising a reset circuit for enabling a reset signal to be applied to said programmable controller.

12. The current driver system of claim 8, wherein said programmable controller comprises a field programmable gate array (FPGA).

13. A multi-channel current driver system comprising:

a programmable controller responsive to said master input clock signal;

a current driver subsystem for generating first and second different current signals that are applied to an external component; and the programmable controller being programmed to control said current driver subsystem to selectively cause said current driver subsystem to generate said first and second current signals;

said programmable controller being configured to turn-on said current signal and to turn off said current signal in synchronization with said master clock signal;

a serial interface for interfacing said programmable controller to a first external subsystem generating a serial output; and a parallel interface for interfacing said programmable controller to a second external subsystem generating a parallel output; and said programmable controller further comprising an input signal loopback system for providing an output signal corresponding to an input signal, to thus verify receipt of said input signal to an external subsystem;

a timer in communication with said programmable controller for setting a specific delay time interval corresponding to a specific current signal turn off point, from a plurality of available different time delay intervals that correspond to a plurality of different current signal turn off points; and said programmable controller interrupting said first current signal upon a detected expiration of said specific time delay interval and applying said second current signal.

14. The current driver system of claim 13, wherein said current driver subsystem includes an overcurrent monitoring subsystem for generating a signal to said programmable controller in response to a threshold current limit being reached for either of said first and second current signals, during operation of said current driver system.

15. The current driver system of claim 13, wherein:

said programmable controller comprises a field programmable gate array (FPGA); and wherein said current driver system further includes a reset circuit for enabling a reset signal to be applied to said programmable controller.

16. A method for applying a current signal to an external component, comprising:

using a master clock to generate a system clock signal;

applying said system clock signal to a programmable controller, and using said programmable controller to receive at least one of a serial and a parallel input signal;

using the programmable controller to control a plurality of current driver subsystems that form a multi-channel current driver system, to cause each of the current driver subsystems to generate a current signal having a desired magnitude;

using the programmable controller to synchronize a turn-on and a turn-off of said current signal to said system clock signal;

using the programmable controller to implement an input signal loopback system for providing an output signal corresponding to an input signal, to thus verify receipt of said input signal to an external subsystem;

using a timer in communication with said programmable controller for setting a specific delay time interval corresponding to a specific current signal turn off point, from a plurality of available different time delay intervals that correspond to a plurality of different current signal turn off points; and using the programmable controller to interrupt a first current signal upon a detected expiration of said specific time delay interval and applying a second current signal.

* * * * *